United States Patent
Kim (10) Patent No.: US 12,113,534 B2
(45) Date of Patent: Oct. 8, 2024

(54) DEVICE FOR ADJUSTING ULTRASONIC RESONANCE FREQUENCY AND METHOD OF CONTROLLING THE SAME

(71) Applicant: Kwang Hee Kim, Icheon-si (KR)

(72) Inventor: Kwang Hee Kim, Icheon-si (KR)

( * ) Notice: Subject to any disclaimer, the term of this patent is extended or adjusted under 35 U.S.C. 154(b) by 0 days.

(21) Appl. No.: 18/193,078

(22) Filed: Mar. 30, 2023

(65) Prior Publication Data

US 2024/0022238 A1    Jan. 18, 2024

(30) Foreign Application Priority Data

Jul. 18, 2022   (KR) .................. 10-2022-0088342

(51) Int. Cl.
| H03K 3/017 | (2006.01) |
| H03K 3/313 | (2006.01) |
| H03K 3/356 | (2006.01) |
| H03K 7/08  | (2006.01) |

(52) U.S. Cl.
CPC ............ H03K 3/017 (2013.01); H03K 3/313 (2013.01); H03K 3/356034 (2013.01); H03K 7/08 (2013.01)

(58) Field of Classification Search
CPC ........................................ H03K 3/017
USPC ........................................ 327/175
See application file for complete search history.

(56) References Cited

U.S. PATENT DOCUMENTS

2021/0263590 A1*   8/2021  Lee ................... B06B 1/0246

FOREIGN PATENT DOCUMENTS

| CN | 210072361 U | 2/2020 |
| JP | 10057914 A | 3/1998 |
| JP | 2003084771 A | 3/2003 |
| JP | 2009226382 A | 10/2009 |
| JP | 4848856 B2 | 12/2011 |
| JP | 4989253 B2 | 8/2012 |
| JP | 5475793 B2 | 4/2014 |
| JP | 2017073586 A | 4/2017 |
| KR | 10-1995-0035070 A | 12/1995 |
| KR | 20-1996-0025863 A | 7/1996 |
| KR | 20-1997-0011079 A | 3/1997 |
| KR | 19990048035 A | 7/1999 |
| KR | 100257930 B1 | 6/2000 |

* cited by examiner

*Primary Examiner* — Tomi Skibinski
(74) *Attorney, Agent, or Firm* — NKL LAW; Jae Youn Kim (57) ABSTRACT

Provided are a device for adjusting an ultrasonic resonance frequency and a method of controlling the same. A device according to an embodiment of the present disclosure includes a circuit board configured to determine and output a resonance frequency. In addition, the device includes a frequency adjustor connected to at least one of a plurality of circuits mounted on the circuit board.

9 Claims, 5 Drawing Sheets

DEVICE FOR ADJUSTING ULTRASONIC RESONANCE FREQUENCY AND METHOD OF CONTROLLING THE SAME

CROSS-REFERENCE TO RELATED APPLICATION

This application is based on and claims priority under 35 U.S.C. § 119 to Korean Patent Application No. 10-2022-0088342, filed on Jul. 18, 2022 in the Korean Intellectual Property Office, the disclosure of which is incorporated by reference herein in its entirety.

BACKGROUND

1. Field

The present disclosure relates to a device for adjusting an ultrasonic resonance frequency and a method of controlling the same.

2. Description of the Related Art

Ultrasonic transducers of medical devices and beauty devices that use the effect of vibration stimulation of ultrasonic waves undergo resonance frequency fluctuation caused by the time used or various reasons.

As the resonance frequency of an ultrasonic transducer fluctuates and does not match with the resonance frequency of an electronic circuit, output efficiency is lowered, excessive current is input, and heat is generated in the ultrasonic transducer and the electronic circuit. An ultrasonic transducer also generates a low-quality output waveform compared to a normal sinusoidal waveform.

To readjust the resonance frequency of an ultrasonic transducer out of the resonance point during use, according to the related art, an expert disassembles a product and adjusts a resonance frequency by manipulating the internal circuit of the disassembled product, such as adjusting a variable resistance value.

However, the above processes incur unnecessary time and costs, and the disassembling of an already manufactured product can have an unexpected adverse effect even on the reliability of the product.

Therefore, the present disclosure is to provide a method of adjusting an ultrasonic resonance frequency initially or during use without disassembling the product.

Information provided in the description of the related art is technical information retained by inventors to derive the present disclosure or acquired in the process of deriving the present disclosure, and thus should not be construed as publicly known art disclosed to the general public prior to the filing of the present disclosure.

SUMMARY

Provided are a device and method for adjusting or readjusting the resonance frequency of an ultrasonic transducer without disassembling a product.

Problems to be solved by the present disclosure are not limited to the aforementioned problems and other problems and advantages of the present disclosure which are not mentioned above will be understood by the following description, and may become more apparent by embodiments of the present disclosure. Further, it is understood that the problems to be solved and advantages of the present disclosure may be embodied by the means and a combination thereof as defined in the claims.

Additional aspects will be set forth in part in the description which follows and, in part, will be apparent from the description, or may be learned by practice of the presented embodiments of the disclosure.

According to an aspect of the disclosure, a frequency adjusting device includes a circuit board configured to determine and output a resonance frequency and a frequency adjustor connected to at least one of a plurality of circuits mounted on the circuit board.

According to another aspect of the disclosure, a method of adjusting a frequency by using a frequency adjusting device includes entering a frequency adjustment mode by using an ingress switch, determining an offset value by using at least one adjusting switch, generating a resonance frequency on the basis of the offset value, identifying an output of the resonance frequency, and releasing the frequency adjustment mode after a predetermined time elapses.

According to another aspect of the disclosure, provided is a computer-readable recording medium for recording a program for executing the method according to another aspect on a computer.

Also, provided is a computer-readable recording medium in which computer programs for executing other methods and other systems for implementing the present disclosure, and the method are stored.

Other aspects, features and advantages other than those described above will become apparent from the following drawings, claims and detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Advantages and features of the present disclosure, and methods for achieving the same will become apparent with reference to the detailed description of embodiments in conjunction with the accompanying drawings. However, it should be understood that the present disclosure is not limited to the embodiments set forth herein, but may be embodied in many different forms, and includes all changes, equivalents, or substitutes that fall within the spirit and technical scope of the present disclosure. The embodiments set forth herein are provided so that the disclosure will be complete, and will fully convey the scope of the disclosure to those of ordinary skill in the art to which the present disclosure pertains to. In the description of the present disclosure, detailed descriptions of the related art are omitted when such detailed descriptions may obscure the essence of the present disclosure.

The terms used in the present application are merely used to describe particular embodiments, and are not intended to limit the present disclosure. An expression used in the singular encompasses an expression in the plural unless it has a clearly different meaning in the context. In the present application, it is to be understood that the terms such as "including" or "having" are intended to indicate the presence of the features, numbers, steps, actions, components, parts, or combinations thereof disclosed in the specification, and are not intended to preclude the possibility that one or more other features, numbers, steps, actions, components, parts, or combinations thereof may exist or may be added.

In addition, in the present specification, when a certain element is referred to as being connected to another element, this includes a case in which the element is directly connected to the other element and also includes a case in which the two elements are electrically connected to each other with another element present therebetween. In addition, a detailed description of elements irrelevant to the present disclosure will not be provided herein so as to clearly explain the present disclosure, and like reference numerals denote like elements throughout the specification.

Furthermore, the connecting lines or connectors between elements illustrated in the drawings are intended to represent exemplary functional relationships and/or physical or logical connections therebetween. Many alternative or additional functional relationships, physical connections, or logical connections between elements may be present in a practical device.

Some embodiments of the present disclosure may be described in terms of functional block components and various processing steps. Some or all of such functional blocks may be realized by various numbers of hardware and/or software components that perform specific functions. For example, functional blocks of the present disclosure may be implemented by one or more microprocessors or circuit components for a predetermined function. In addition, for example, functional blocks of the present disclosure may be implemented with various programming or scripting languages. The functional blocks may be implemented in algorithms that are executed on one or more processors. Furthermore, the present disclosure may adopt the related art for electronic environment set-up, signal processing, and/or data processing. Terms such as "mechanism," "element," "means," and "configuration" may be used broadly and are not limited to mechanical or physical components, and terms such as "unit" and "module" refer to a unit that processes at least one function or operation and may be implemented as hardware, software or a combination thereof.

Hereinafter, the present disclosure will be described in detail with reference to the accompanying drawings.

Figure 1:
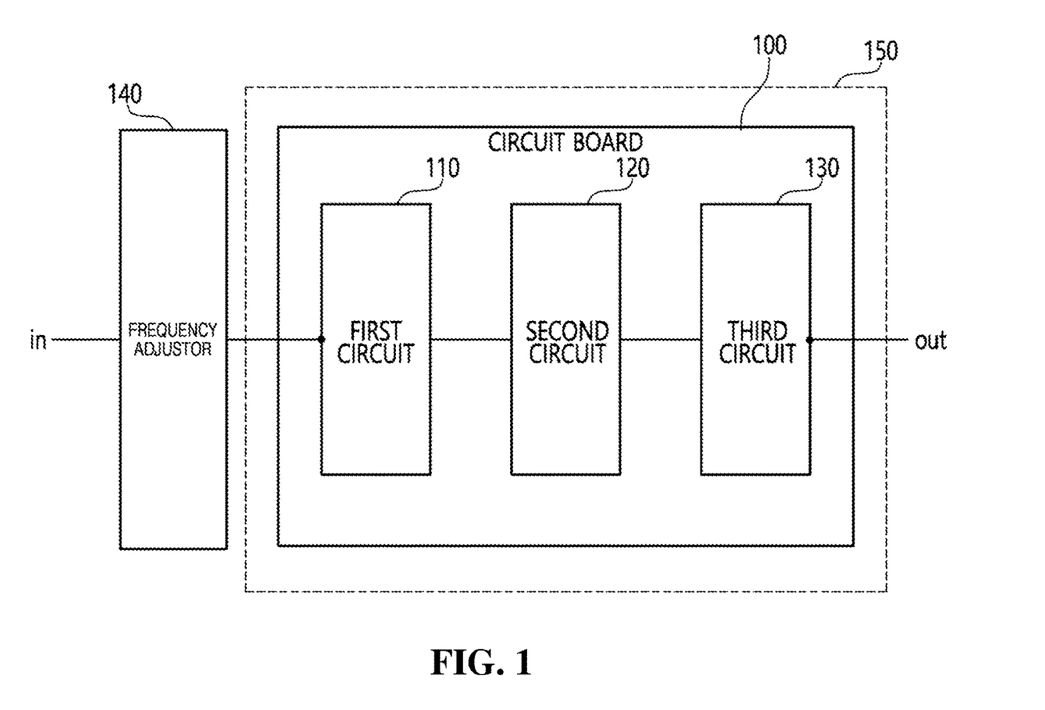
FIG. 1 is a block diagram of a frequency adjusting device according to an embodiment.

FIG. 1 is a block diagram of a frequency adjusting device according to an embodiment.

Referring to FIG. 1, the frequency adjusting device (hereinafter, referred to as "device") according to the present disclosure may include a circuit board 100, a plurality of circuits 110, 120 and 130 mounted on the circuit board 100, a frequency adjustor 140 connected to at least one of the plurality of circuits 110, 120 and 130, and a housing 150 configured to accommodate and protect the circuit board 100.

In an embodiment, the plurality of circuits 110, 120 and 130 mounted on the circuit board 100 may include a first circuit 110, a second circuit 120, and a third circuit 130. The first to third circuits may be the same circuit or circuits that perform the same function, but are illustrated separately for description of the present embodiment, and the function and number of the mounted circuits are not limited thereto.

The frequency adjustor 140 may be connected to at least one of the plurality of circuits 110, 120 and 130 to transmit an input for adjusting a resonance frequency to the circuit board 100. A detailed description of the frequency adjustor will be described below with reference to FIG. 2.

The housing 150 may accommodate the circuit board 100 therein and protect the circuit board 100. The housing 150 may be an external case that is gripped by a user to use an ultrasonic transducer, or a package for protecting the circuit board 100. Although FIG. 1 illustrates that the housing 150 accommodates the circuit board 100 and does not accommodate the frequency adjustor 140, the present disclosure is not limited thereto.

Figure 2:
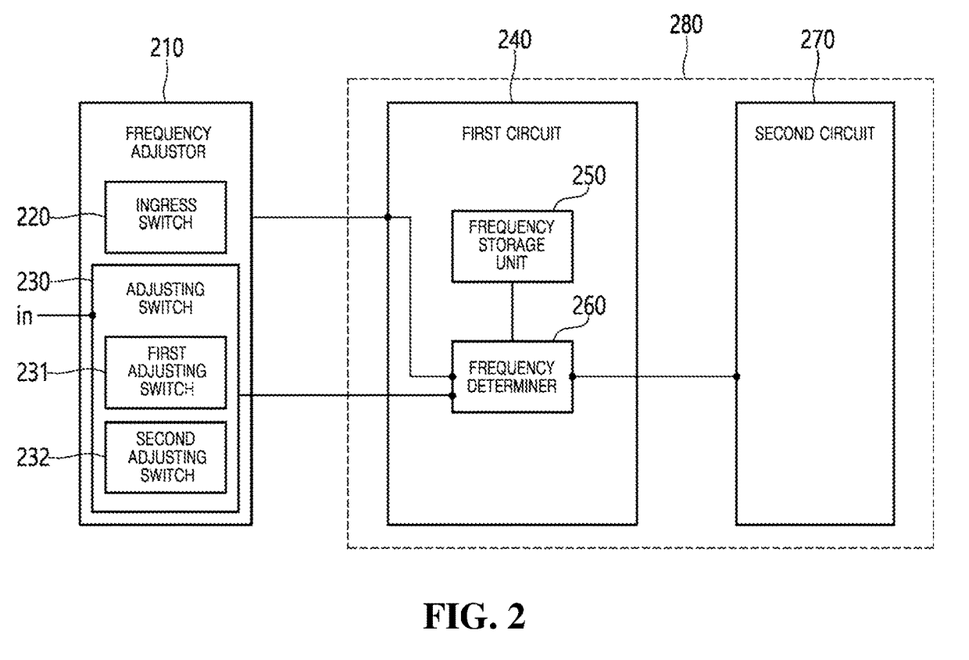
FIG. 2 is a diagram for explaining the operation of a frequency adjustor and a first circuit, according to an embodiment.

FIG. 2 is a diagram for explaining the operation of a frequency adjustor 210 and a first circuit 240, according to an embodiment.

Referring to FIG. 2, the frequency adjustor 210 may include an ingress switch 220 and an adjusting switch 230.

The ingress switch 220 may be a switch configured to enter a frequency adjustment mode. The frequency adjustment mode may refer to a state in which the first circuit 240 can receive an input of an offset value (offset_value) from the frequency adjustor 210. In an embodiment, the first circuit 240 may be activated in the frequency adjustment mode, and may be inactivated in a frequency adjustment release mode. That is, the ingress switch 220 may control the first circuit 240 to receive an input of an offset value from the adjusting switch only in the frequency adjustment mode.

For example, when the ingress switch 220 is in an on state, the first circuit 240 is in an activated frequency adjustment mode and may receive an input of an offset value from the frequency adjustor 210. On the other hand, when the ingress switch 220 is in an off state, the first circuit 240 is in an inactivated frequency adjustment release mode and unable to receive an input of an offset value from the frequency adjustor 210.

In an embodiment, the first circuit 240 may be activated and inactivated through a transistor mounted on the first circuit 240.

In the present disclosure, the offset value may correspond to the difference between an existing frequency and a frequency to be changed, and the offset value may be a positive offset value when the frequency to be changed is higher than the existing frequency, and may be a negative offset value when the frequency to be changed is lower than the existing frequency.

The adjusting switch 230 may be a switch configured to input an offset value to the circuit board or the first circuit 240. In an embodiment, the adjusting switch 230 may include a first adjusting switch 231 configured to input a positive offset value from among the offset values and a second adjusting switch 232 configured to input a negative offset value from among the offset values.

Meanwhile, the offset value may be determined or defined by a processor included in the device or provided separately, or by a user of the device.

In an embodiment, the frequency adjustor 210 may be exposed on one side of a housing 290 and connected to the first circuit 240 so that an offset value can be input to the first circuit from the outside of the housing 290. According to the related art, a product (e.g., a housing) is disassembled to readjust the resonance frequency of an ultrasonic transducer out of a resonance point. As in the present embodiment, however, the frequency adjustor 210 is exposed on one side of the housing 290, and thus, there is no need to directly manipulate the circuit board including the first circuit, and the resonance frequency may be simply readjusted by inputting an offset value to the first circuit even from the outside of the housing 290.

In an embodiment, the device may further include a conductive support member so that the frequency adjustor 210 is connected to the first circuit 240 and at the same time, is exposed on one side of the housing 290. Thus, even though the housing 290 is not conductive (e.g., plastic), the first circuit 240 may receive an input of an offset value from the frequency adjustor 210.

The first circuit 240 may receive an input of an offset value from the frequency adjustor 210 and output a pulse width modulation (PWM) signal. The PWM signal is a digital signal with a modulated pulse width, and may refer to a signal in which a ratio (duty cycle) of 0 (OFF) and 1 (ON) of the digital signal is adjusted. In an embodiment, the PWM signal output from the first circuit 240 may be a signal in which the offset value input from the frequency adjustor 210 is reflected. That is, since the pulse width is modulated on the basis of the offset value, the offset value may be calculated by analyzing the PWM signal.

The first circuit 240 may include a frequency storage unit 250 and a frequency determiner 260.

A default value (default_value) corresponding to the existing frequency may be stored in the frequency storage unit 250. In addition, the PWM signal, which is an output value of the first circuit 240, may be stored in the frequency storage unit 250.

In an embodiment, the frequency storage unit 250 transmits the stored default value to the frequency determiner 260, and the frequency determiner 260 may store the output PWM signal on the basis of the default value and the offset value input from the frequency adjustor 210. In another embodiment, the frequency storage unit 250 may store the offset value input from the frequency adjustor 210.

The frequency determiner 260 may receive an input of an offset value from the frequency adjustor 210, and output a PWM signal corresponding to a resonance frequency to be changed, on the basis of the default value and the offset value. A process in which the frequency determiner 260 outputs a PWM signal may be the same as the process in which the first circuit 240 outputs a PWM signal, as described above.

The PWM signal output from the frequency determiner 260 corresponds to a new value (new-value) of Expression 1 below.

$$\text{new value} = \text{default\_value} \pm \text{offset\_value} \quad [\text{Expression 1}]$$

In Expression 1, new value refers to a new value corresponding to the PWM signal output from the frequency determiner 260, default_value refers to a default_value stored in the frequency storage unit 250, and offset_value refers to an offset_value input from the frequency adjustor 210. Particularly, +offset_value may refer to a positive offset_value input from the first adjusting switch 231, and −offset_value may refer to a negative offset_value input from the second adjusting switch 232.

The PWM signal output from the first circuit 240 may be transmitted to an input of the second circuit 270.

Figure 3:
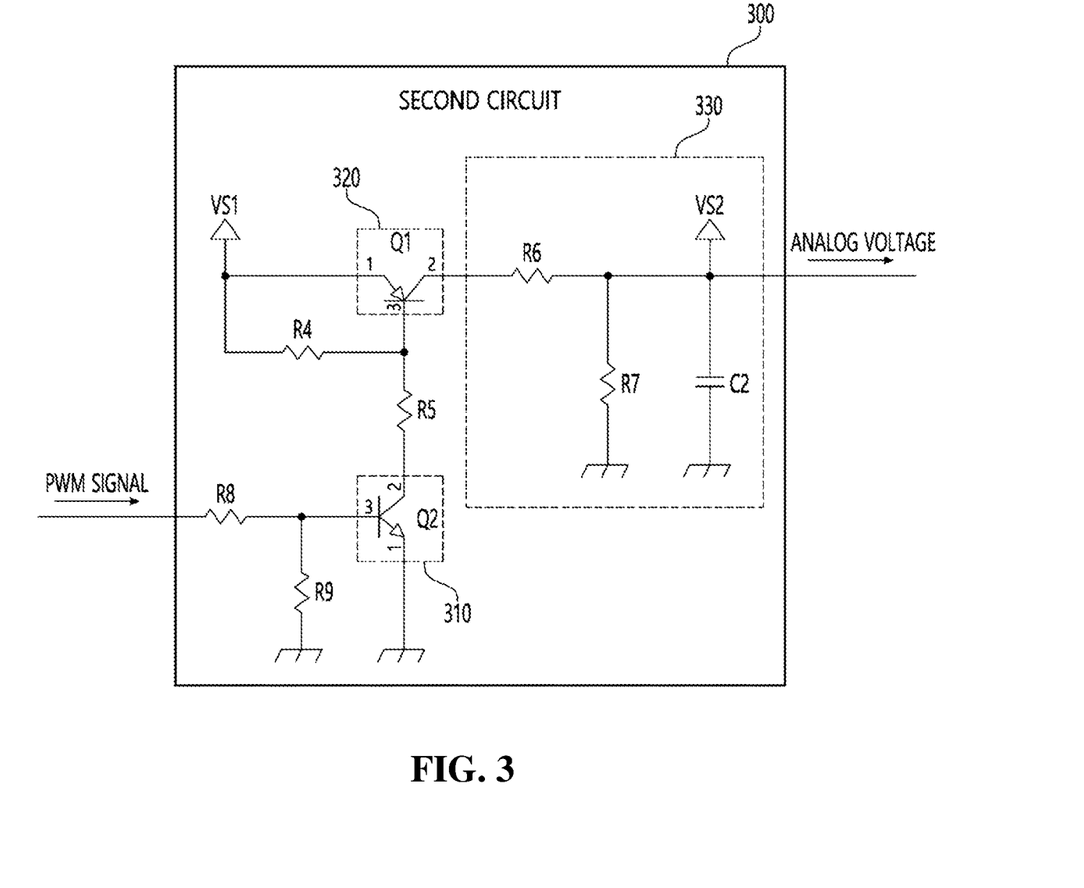
FIG. 3 is a view for explaining the operation of a second circuit according to an embodiment.

FIG. 3 is a view for explaining the operation of a second circuit 300 according to an embodiment.

Referring to FIG. 3, the second circuit 300 may receive an input of a PWM signal, convert the PWM signal into an analog voltage, and output the analog voltage. An analog voltage is a continuous electrical quantity that quantifies a potential difference, and is distinguished from a digital voltage having a fixed voltage level like a PWM signal.

In an embodiment, the second circuit 300 may smooth the PWM signal and convent the same into an analog voltage. For example, to smooth the PWM signal, the second circuit 300 may include at least one smoothing circuit selected from a condenser filter, an inductor filter, an LC filter, and a it-type filter.

The second circuit 300 may include a smoothing processor 330 configured to convert the PWM signal into an analog voltage. Referring to FIG. 3, the smoothing processor 330 is illustrated as including a condenser filter, but may correspond to any one of the plurality of smoothing circuits described above, and the present disclosure is not limited thereto.

Meanwhile, the second circuit 300 may include at least one of transistors 310 and 320 that receive an input of the PWM signal and generate a switching signal.

When a transistor is used as a switch, the device may be controlled with a small amount of current. In addition, if an excessive current flows to a device such as a micro controller unit (MCU) mounted on a circuit board, input/output pins inside the MCU and related circuits may be damaged. Thus, a transistor may be used as a switch to protect the input/output circuit of the MCU.

In an embodiment, the transistor 310 of the second circuit 300 may generate a switching signal by switching the other transistor 320 of the second circuit 300. In this case, the smoothing processor 330 may convert the PWM signal on the basis of the switching signal.

Figure 4:
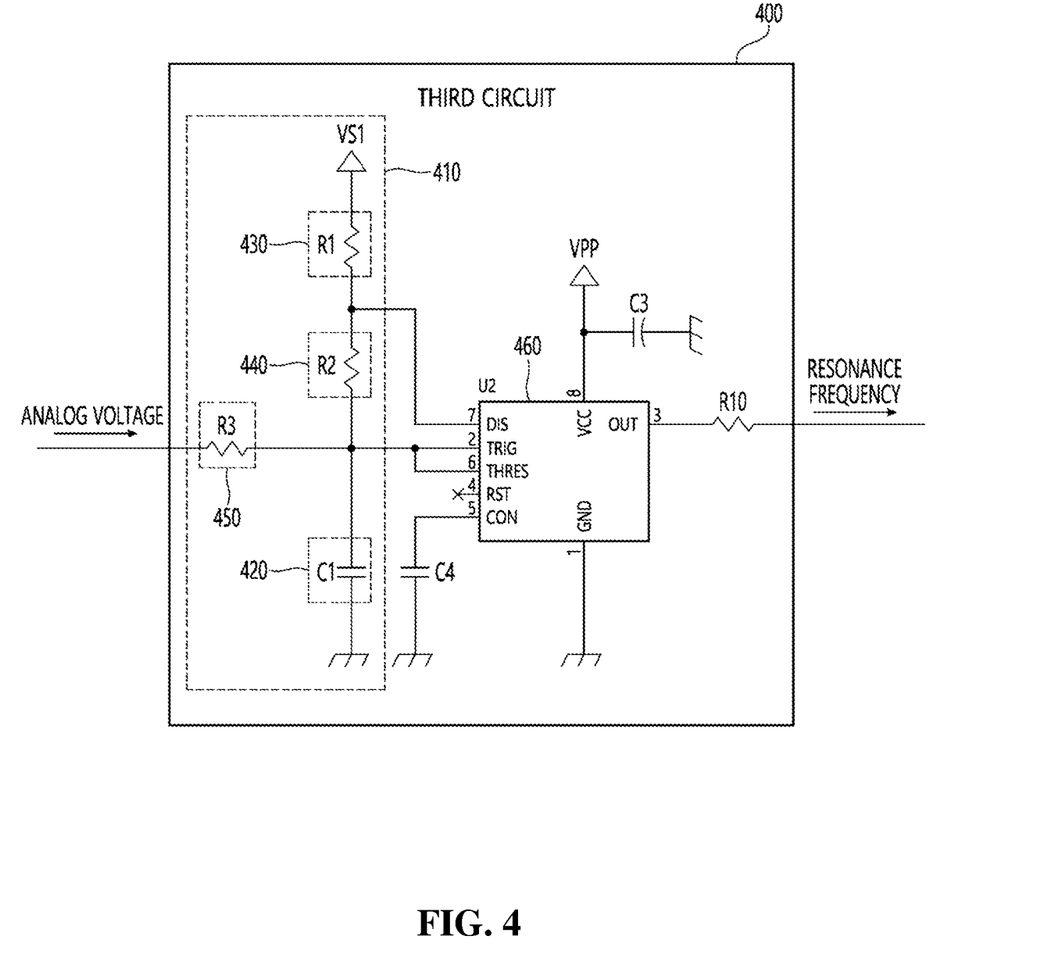
FIG. 4 is a view for explaining the operation of a third circuit according to an embodiment.

FIG. 4 is a view for explaining the operation of a third circuit 400 according to an embodiment.

Referring to FIG. 4, the third circuit 400 may generate a resonance frequency by using an analog voltage. The term "resonance frequency" as used herein may refer to a frequency for matching the resonance frequency between an ultrasonic transducer and an electronic circuit, different from the existing frequency.

In an embodiment, the third circuit 400 may include an oscillator 410 configured to output a frequency signal by repeating charging and discharging, and a frequency generator 460 configured to output a resonance frequency on the basis of the frequency signal output from the oscillator 410.

The oscillator 410 may include at least one capacitor 420 and a plurality of resistors 430, 440 and 450, and may output a frequency signal on the basis of the charging and discharging characteristics of the capacitor.

In an embodiment, the oscillator 410 may include a first resistor 430, a second resistor 440, the third resistor 450, and a first capacitor 420 configured to repeat charging and discharging. In addition, the oscillator 410 may output a frequency signal by using the analog voltage input from the second circuit as a trigger.

For example, the first capacitor 420 may be charged through the first resistor 430, the second resistor 440, and the third resistor 450 for a time $t_1$. In addition, the first capacitor 420 may be discharged through the second resistor 440 for a time $t_2$. In other words, the time $t_1$ may be the charging time of the first capacitor 420, and the time $t_2$ may be the discharging time of the first capacitor 420.

Through such charging and discharging operations of the first capacitor 420, the oscillator 410 may act as a multivibrator and output a frequency signal.

In an embodiment, the frequency generator 460 may receive an input of the frequency signal output from the oscillator 410 and output a resonance frequency.

In this regard, the resonance frequency may be expressed as below.

$$f_{out} = \frac{1}{(t_1 + t_2)} \quad \text{[Expression 2]}$$

As described above, when the time $t_1$ refers to the charging time of the first capacitor 420, and the time $t_2$ refers to the discharging time of the first capacitor 420, $f_{out}$ may refer to the resonance frequency output from the frequency generator 460.

Accordingly, the device may set the resonance frequency generated by the third circuit to be identical to the resonance frequency of an electronic circuit of the device by replacing the changed existing frequency of an ultrasonic transducer.

The device may further include a verifier (not shown) configured to identify and verify the resonance frequency output from the third circuit.

In an embodiment, the verifier (not shown) may include a feedback receiver (not shown) configured to receive feedback from a user who places water droplets. For example, the feedback receiver (not shown) may be a surface-treated flat plate. The water droplets may be distilled water or a mixture such as tap water.

In an embodiment, the verifier (not shown) may include a determiner (not shown) configured to identify the output frequency and verify the resonance frequency. For example, the determiner (not shown) may verify the resonance frequency by applying the frequency output from the third circuit to water droplets and identifying the behavior of the water droplets. In other words, the result of the verification may be a change in the shape of water droplets and/or a vibration pattern of water droplets.

In other embodiments, the determiner (not shown) may include a camera configured to analyze a change in the shape of water droplets and/or a vibration pattern of water droplets. For example, the camera may be a high-speed camera. The determiner (not shown) may photograph the behavior of water droplets by using a camera, and compare the amount of change in shape at the output frequency with the amount of change in shape within and outside the minute interval of the output frequency, to verify whether the output frequency is a resonance frequency. The determiner (not shown) may extract and use the pre-stored resonance frequency value of water droplets for verification.

In another embodiment, the device may separately include cameras for analyzing a change in the shape of water droplets and/or a vibration pattern of water droplets. The determiner (not shown) may receive images of water droplets from a camera. The determiner (not shown) may calculate the width and height of a water droplet in each of the received images, and calculate the amount of change in the shape of the water droplet therefrom. The determiner (not shown) may verify whether the output frequency is a resonance frequency, by comparing the amount of change in shape at the output frequency with the amount of change in shape within and outside the minute interval of the output frequency.

The method of verifying the output of the resonance frequency by the device is not limited to the above-described embodiment.

Figure 5:
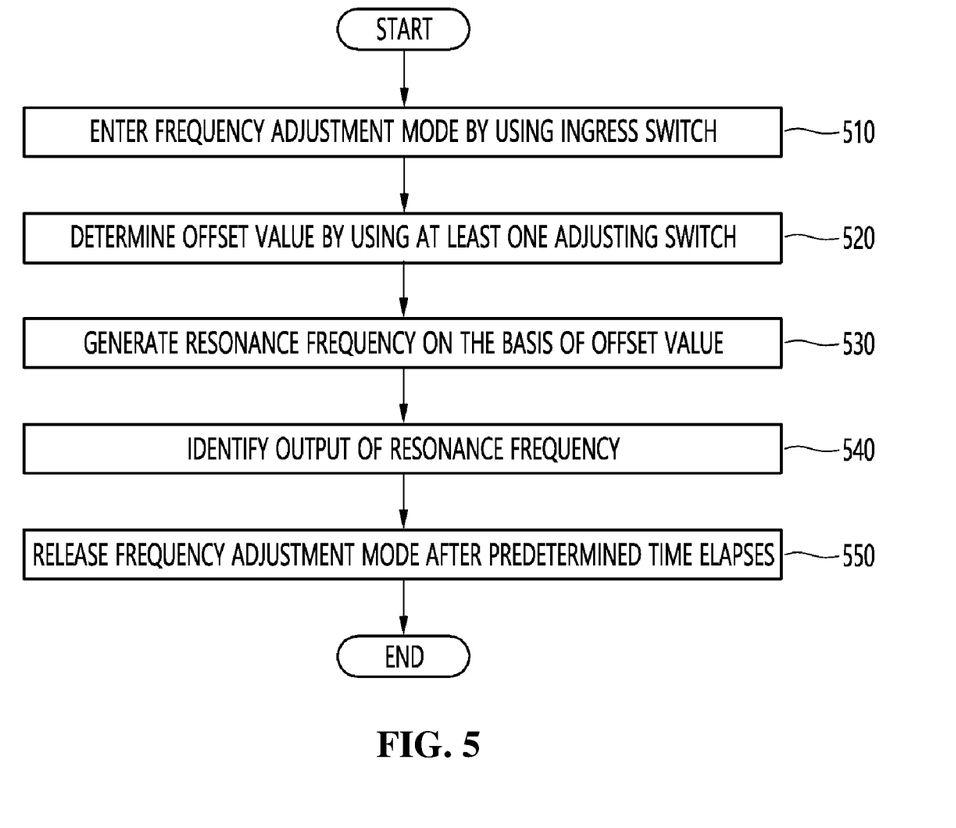
FIG. 5 is a flowchart illustrating a method of controlling a frequency adjusting device, according to an embodiment.

FIG. 5 is a flowchart illustrating a method of controlling a frequency adjusting device, according to an embodiment.

Referring to FIG. 5, the method of controlling a device may include entering a frequency adjustment mode by using an ingress switch (operation 510), determining an offset value by using at least one adjusting switch (operation 520), generating a resonance frequency on the basis of the offset value (operation 530), identifying an output of the resonance frequency (operation 540), and releasing the frequency adjustment mode after a predetermined time elapses (operation 550).

Hereinafter, each operation will be described in detail. The descriptions provided with reference to FIGS. 1 to 4 of the present specification can equally apply herein, and thus redundant descriptions are omitted.

In operation 510, the device may enter a frequency adjustment mode by using an ingress switch. The device may enter the frequency adjustment mode on the basis of an input value of the ingress switch. For example, the input value of the ingress switch may be on or off.

In an embodiment, the device may enter the frequency adjustment mode when the ingress switch is in an on state, and the frequency adjustment mode may be released when the ingress switch is in an off state (frequency adjustment release mode).

In other embodiments, the device may control the first circuit to receive an input of an offset value from the adjusting switch only in the frequency adjustment mode.

An input for switching the ingress switch into an on or off state may be performed by a processor included in the device or provided separately, or arbitrarily performed by a user, in response to determining that the resonance frequency needs to be adjusted.

In an embodiment, the device may enter the frequency adjustment mode when the input of the ingress switch is maintained for a predetermined period of time or longer, and may not enter the frequency adjustment mode when the input of the ingress switch is not maintained for a predetermined period of time or longer. In another embodiment, the device may enter the frequency adjustment mode only while the input of the ingress switch is maintained, and may release the frequency adjustment mode when the input of the ingress switch is stopped.

The device includes an ingress switch to set the frequency adjustment mode, and thus prevents the frequency from fluctuating due to negligence or unexpected variables even when the frequency adjustor is provided outside the circuit board, and at the same time, has the effect of simply entering the frequency adjustment mode.

Meanwhile, the device may include at least one transistor for an operation of the ingress switch, related to entering the frequency adjustment mode.

In operation 520, the device may determine an offset value by using at least one adjusting switch. The adjusting switch may include a first adjusting switch configured to input a positive offset value, and a second adjusting switch configured to input a negative offset value.

In an embodiment, the device may determine an offset value on the basis of an input value of the adjusting switch. For example, the device may transmit a positive unit offset value to the first circuit when the first adjusting switch receives an input. Particularly, when the first adjusting switch receives three inputs, a value that is three times the positive unit offset value may be transmitted to the first circuit.

Similarly, the device may transmit a negative unit offset value to the second circuit when the second adjusting switch receives an input. Particularly, when the second adjusting switch receives three inputs, a value that is three times the negative unit offset value may be transmitted to the first circuit.

Taken together, in a case in which m and n are natural numbers of 1 or more, when the first adjusting switch receives m inputs, and the second adjusting switch receives n inputs, the device may transmit a value that is (m-n) times (a negative offset value when n is greater than m) the unit offset value to the first circuit.

In other embodiments, the device includes a housing configured to accommodate and protect the circuit board, and the above-described ingress switch and at least one adjusting switch may be exposed on one side of the housing and connected to at least a portion of the circuit board, to enter the frequency adjustment mode and input an offset value from the outside of the housing.

In operation 530, the device may generate a resonance frequency on the basis of the offset value.

The device may include a first circuit configured to receive an input of an offset value from the frequency adjustor and output a PWM signal, a second circuit configured to convert the PWM signal into an analog voltage, and a third circuit configured to generate a resonance frequency by using the analog voltage.

Descriptions of the first circuit, the second circuit, and the third circuit are already provided in the descriptions with reference to FIGS. 1 to 4, and thus are omitted herein.

In operation 540, the device may identify an output of the resonance frequency.

In an embodiment, the device may identify the output of the resonance frequency by using a method of measuring radiation force applied to a measurement target, a determination method by scanning into an ultrasonic sound field by using a calibrated hydrophone, a method using a photoacoustic effect, a thermodynamic method using the saturation temperature inside an ultrasonic sound-absorbing material, or the like.

In other embodiments, the device may include or separately include an ultrasonic power meter to identify the output of the resonance frequency. For example, the ultrasonic power meter may identify the output of the resonance frequency through a method of measuring radiation force. In another embodiment, the device may receive user feedback to identify the output of the resonance frequency and verify the resonance frequency on the basis of the user feedback.

In operation 550, the device may release the frequency adjustment mode after a predetermined time elapses. For example, the predetermined time may be three seconds.

In an embodiment, the device may identify the output of the resonance frequency and release the frequency adjustment mode when a certain criterion is satisfied for a predetermined period of time. In this case, the frequency adjustment mode may be automatically released.

In other embodiments, the device may enter the frequency adjustment mode only while the input of the ingress switch is maintained, and may be operated so that the frequency adjustment mode is released, when the input of the ingress switch is stopped. In another embodiment, when the output of the resonance frequency is identified and a certain criterion is satisfied for a predetermined period of time, the device may be operated so that the input of the ingress switch is stopped. The device may include at least one transistor to perform the above operations.

The method according to an embodiment may be implemented in the form of program instructions that can be executed through various computer means and may be recorded on a computer-readable recording medium. The computer-readable recording medium may include one or a combination of program instructions, data files, data structures, and the like. Program instructions recorded on the medium may be designed and configured especially for the embodiments, or may be already known and available to those of ordinary skill in the art in the computer software field. Examples of computer-readable recording media include magnetic media such as hard disks, floppy disks, and magnetic tapes, optical media such as CD-ROMs and DVDs, magneto-optical media such as floptical disks, and hardware devices such as ROM, RAM, flash memory or the like which are especially configured to store and perform the program instructions. Examples of program instructions include not only machine language codes such as those generated by a complier, but also high-level language codes that can be executed by a computer using an interpreter or the like. The above-described hardware devices may be configured to act as one or more software modules in order to perform the operations of the embodiments, or vice versa.

The particular implementations described herein are embodiments and are not intended to limit the scope of the present disclosure in any way. For the brevity of the specification, conventional electronic configurations, control systems, software, and other functional aspects of the systems may not be described.

Moreover, components illustrated in the drawings may not be essential components for the practice of the present disclosure unless the components are specifically described as "essential" or "critical."

Unless the order of operations of the method according to the present disclosure is explicitly mentioned or described otherwise, the operations may be performed in a proper order. The present disclosure is not necessarily limited according to the order of the operations. The use of all examples or exemplary terms (e.g., and/or the like) in the present disclosure is merely intended to describe the present disclosure in detail, and the scope of the present disclosure is not limited by the examples or exemplary terms unless defined by the claims. In addition, it will be understood by those of ordinary skill in the art that various modifications, combinations and changes may be made according to design conditions and factors within the scope of the appended claims or the equivalents thereof.

Therefore, the spirit of the present disclosure is defined by the following claims rather than the above-described embodiments, and all scopes equivalent to the claims or all equivalent changes therefrom should be construed as being within the scope of the present disclosure.

According to the embodiments described above, in a process of setting the resonance frequency of an ultrasonic transducer when a product is initially produced, time and costs can be saved due to the simplification of work, and the reliability of the manufactured product can be secured, thus resulting in improved productivity.

According to other embodiments described above, when after-sales service is provided to a customer due to the occurrence of resonance frequency fluctuation, there can be provided a very efficient method in which a frequency is adjusted only with simple manipulation without disassembling a product, or the resonance frequency of an ultrasonic transducer to be replaced is initially set.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A frequency adjusting device comprising:
    a circuit board configured to determine and output a resonance frequency; and
    a frequency adjustor connected to at least one of a plurality of circuits mounted on the circuit board,
    wherein the plurality of circuits comprises:
    a first circuit configured to receive an input of an offset value from the frequency adjustor and output a pulse width modulation (PWM) signal;
    a second circuit configured to convert the PWM signal into an analog voltage; and
    a third circuit configured to generate the resonance frequency by using the analog voltage.

2. The frequency adjusting device of claim 1, further comprising
    a housing accommodating and protecting the circuit board,
    wherein the frequency adjustor is exposed on one side of the housing and connected to the circuit board to enable the offset value to be input to the circuit board from an outside of the housing.

3. The frequency adjusting device of claim 1, wherein the frequency adjustor comprises:
    an ingress switch configured to enter a frequency adjustment mode; and
    at least one adjusting switch configured to input the offset value,
    wherein the ingress switch controls the first circuit to receive the input of the offset value from the at least one adjusting switch only in the frequency adjustment mode.

4. The frequency adjusting device of claim 1, wherein the first circuit comprises:
    a frequency storage configured to store a default value corresponding to an existing frequency; and
    a frequency determiner configured to receive the input of the offset value from the frequency adjustor, and output the PWM signal corresponding to the resonance frequency on the basis of the default value and the offset value,
    wherein the frequency storage stores the PWM signal.

5. The frequency adjusting device of claim 1, wherein the second circuit comprises:
    at least one transistor configured to receive an input of the PWM signal and generate a switching signal; and
    a smoothing processor configured to convert the PWM signal into the analog voltage on the basis of the switching signal.

6. The frequency adjusting device of claim 1, wherein the third circuit comprises:
    an oscillator configured to output a frequency signal by repeating charging and discharging; and
    a frequency generator configured to output the resonance frequency on the basis of the frequency signal.

7. The frequency adjusting device of claim 6, wherein the oscillator comprises a first resistor, a second resistor, a third resistor, and a capacitor, and operates by using the analog voltage as a trigger,
    wherein the capacitor is charged on the basis of the analog voltage and the first to third resistors, and discharged on the basis of the analog voltage and the second resistor.

8. The frequency adjusting device of claim 1, wherein the offset value is defined by a user.

9. A method of adjusting a frequency by using the frequency adjusting device of claim 1, the method comprising:
    entering a frequency adjustment mode by using an ingress switch;
    determining an offset value by using at least one adjusting switch;
    generating a resonance frequency on the basis of the offset value;
    identifying an output of the resonance frequency; and
    releasing the frequency adjustment mode after a predetermined time elapses,
    wherein the frequency adjustor comprises the ingress switch and the at least one adjusting switch.

* * * * *